(12) United States Patent
Ogasawara

(10) Patent No.: US 9,859,096 B2
(45) Date of Patent: Jan. 2, 2018

(54) INSPECTION APPARATUS AND INSPECTION METHOD

(71) Applicant: NuFlare Technology, Inc., Yokohama-shi (JP)

(72) Inventor: Munehiro Ogasawara, Hiratsuka (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 15/358,324

(22) Filed: Nov. 22, 2016

(65) Prior Publication Data

US 2017/0243716 A1 Aug. 24, 2017

(30) Foreign Application Priority Data

Feb. 22, 2016 (JP) .................. 2016-031170

(51) Int. Cl.
| | | |
|---|---|---|
| *G01B 9/02* | (2006.01) | |
| *G01B 11/02* | (2006.01) | |
| *H01J 37/244* | (2006.01) | |
| *H01J 37/26* | (2006.01) | |
| *H01J 37/22* | (2006.01) | |

(Continued)

(52) U.S. Cl.
CPC .......... *H01J 37/265* (2013.01); *H01J 37/147* (2013.01); *H01J 37/20* (2013.01); *H01J 37/222* (2013.01); *H01J 37/244* (2013.01); H01J 2237/20285 (2013.01); H01J 2237/221 (2013.01); H01J 2237/2448 (2013.01)

(58) Field of Classification Search
USPC ............ 250/306, 307, 310, 311, 397, 396 R, 250/492.3, 494.1
See application file for complete search history.

(56) References Cited

U.S. PATENT DOCUMENTS 5,923,034 A * 7/1999 Ogasawara ............. H01J 37/26
250/311
7,508,526 B2 * 3/2009 Ogawa ............. G01N 21/95607
356/491

(Continued)

FOREIGN PATENT DOCUMENTS

JP 11-16967 1/1999
JP 11-37957 2/1999

(Continued)

*Primary Examiner* — Bernard Souw
(74) *Attorney, Agent, or Firm* — Oblon, McClelland, Maier & Neustadt, L.L.P.

(57) ABSTRACT

An inspection apparatus according to an embodiment includes an irradiation part configured to irradiate an inspection target substrate with multiple beams including energy beams, a detector, on which a plurality of charged particle beams of charged particles released from the inspection target substrate are imaged, configured to detect each of the charged particle beams as an electrical signal, and a comparing unit configured to compare reference image data and image data that is reproduced based on the detected electrical signals and that represents patterns formed on the inspection target substrate to inspect the patterns. The detector includes a plurality of detecting elements corresponding one-to-one to the charged particle beams. The detecting elements each have a size greater than a size that covers a beam blur of each charged particle beam imaged on the detector.

16 Claims, 12 Drawing Sheets

(51) Int. Cl.
*H01J 37/20* (2006.01)
*H01J 37/147* (2006.01)

(56) References Cited

U.S. PATENT DOCUMENTS

| | | | |
|---|---|---|---|
| 2006/0082782 A1* | 4/2006 | Ogawa | G01N 21/95607 356/495 |
| 2017/0178862 A1* | 6/2017 | Ogasawara | H01J 37/045 |
| 2017/0243715 A1* | 8/2017 | Ogasawara | H01J 37/244 |

FOREIGN PATENT DOCUMENTS

| | | |
|---|---|---|
| JP | 11-83753 | 3/1999 |
| JP | 2003-167061 | 6/2003 |

* cited by examiner

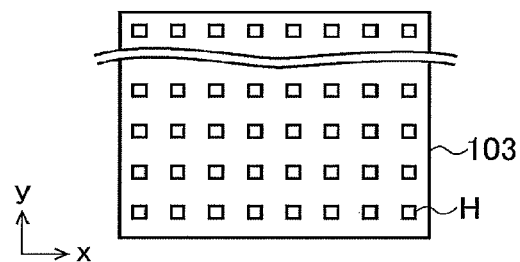
FIG. 2
FIG. 3A
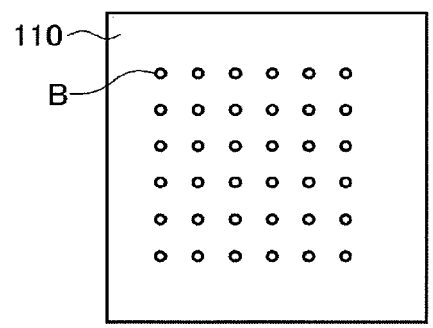
FIG. 3B
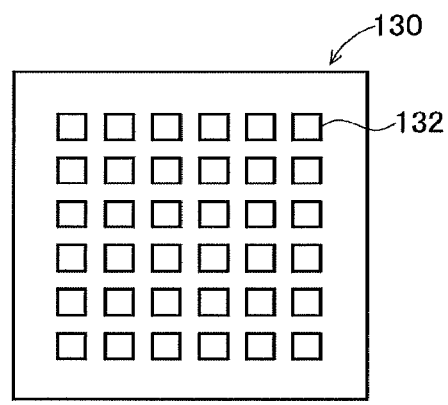
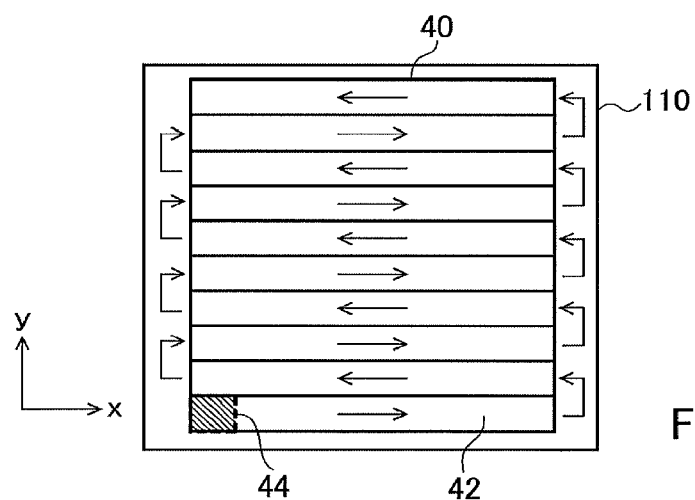
FIG. 4 t=T t=2T t=3T t=4T t=5T t=6T t=7T t=8T t=9T t=T t=2T t=3T t=4T t=5T t=6T t=7T t=8T t=9T t=T t=2T t=3T t=4T t=5T t=6T t=7T

INSPECTION APPARATUS AND INSPECTION METHOD

CROSS REFERENCE TO RELATED APPLICATION

This application is based upon and claims benefit of priority from the Japanese Patent Application No. 2016-031170, filed on Feb. 22, 2016, the entire contents of which are incorporated herein by reference.

FIELD

The present invention relates to an inspection apparatus and an inspection method.

BACKGROUND

As LSI circuits are increasing in density, circuit linewidths of semiconductor devices are becoming finer. In manufacturing a semiconductor device, an exposure mask (also called a reticle, which is used in a stepper or a scanner) having a circuit pattern is used. An exposure apparatus transfers the pattern to a wafer.

Examples of factors that reduce the yield of manufacturing semiconductor devices include a defect of a pattern formed on a mask or a wafer. There is a need to accurately inspect pattern defects. For example, a known apparatus inspects patterns on a sample for defects by irradiating the sample with a plurality of electron beams (multiple beams) and allowing a detector to detect reflected electrons or secondary electrons released from the sample. The use of multiple beams provides higher throughput of defect inspection than an inspection apparatus using a single electron beam (single beam).

Related-art inspection apparatuses using multiple beams have a disadvantage in that the blur or movement of beams on the surface of the detector causes the beams to be out of a light-receiving area of the detector, leading to reduced inspection accuracy.

BRIEF DESCRIPTION OF THE DRAWINGS

FIG. 2 is a schematic diagram of the configuration of an aperture mask;

FIG. 3A illustrates beam irradiation positions on a substrate and FIG. 3B is a diagram illustrating detecting elements included in a detector;

FIG. 4 is a diagram explaining an exemplary inspection operation;

DETAILED DESCRIPTION

In one embodiment, an inspection apparatus includes an irradiation part irradiating an inspection target substrate with multiple beams including energy beams, a detector on which a plurality of charged particle beams of charged particles released from the inspection target substrate are imaged, the detector detecting each of the charged particle beams as an electrical signal, and a comparing processing circuitry comparing reference image data and image data that is reproduced based on the detected electrical signals and that represents patterns formed on the inspection target substrate to inspect the patterns. The detector includes a plurality of detecting elements corresponding to the charged particle beams. The detecting elements each have a size greater than a size that covers a beam blur of each charged particle beam imaged on the detector.

An embodiment of the present invention will be described below with reference to the drawings.

Figure 1:
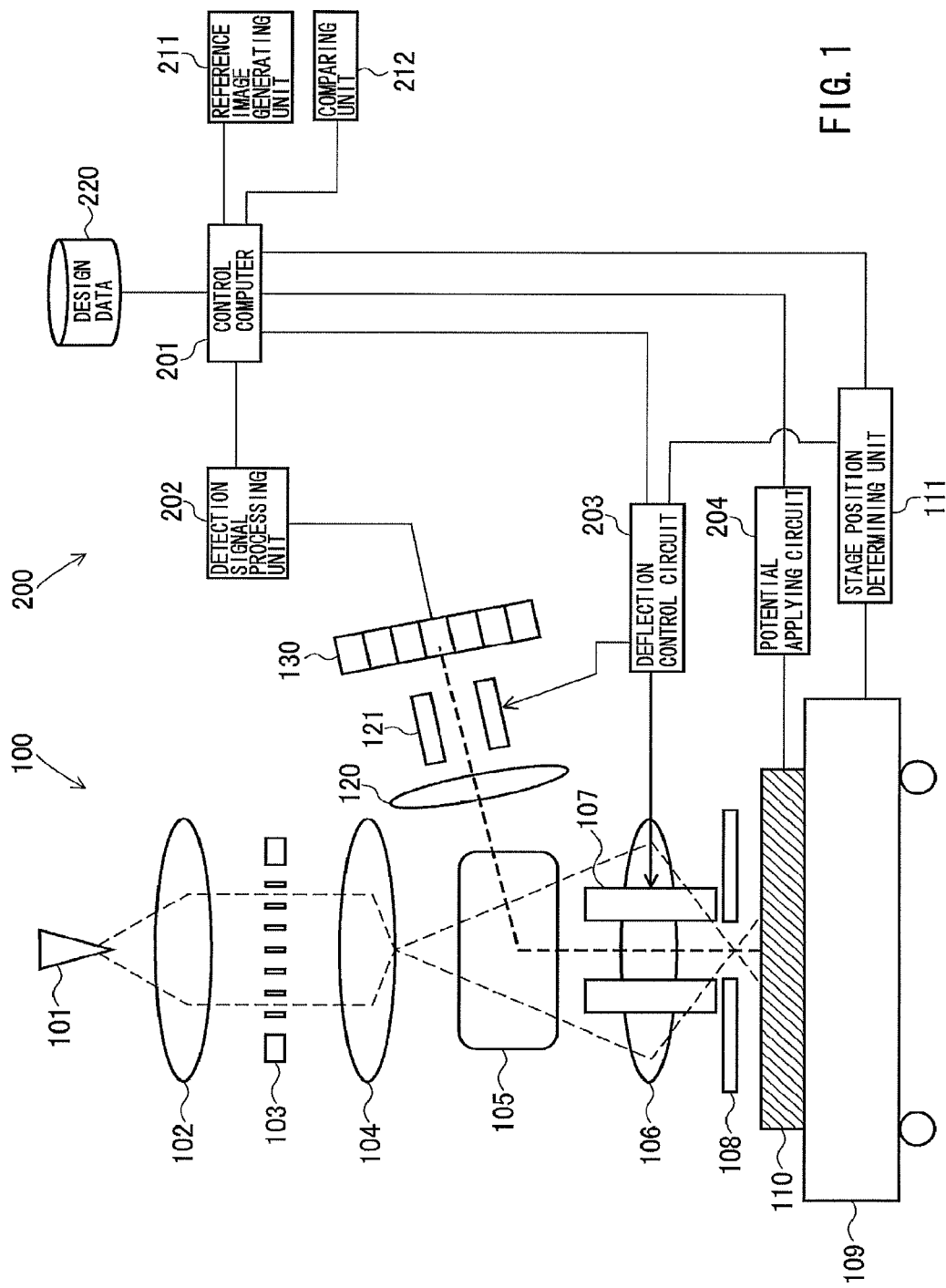
FIG. 1 is a schematic diagram of the configuration of an inspection apparatus according to an embodiment of the present invention.

FIG. 1 is a schematic diagram of the configuration of an inspection apparatus according to an embodiment of the present invention. As illustrated in FIG. 1, the inspection apparatus includes an image acquisition unit 100 for acquiring image data of a substrate 110, serving as an inspection target, and an arithmetic and control unit 200 that controls the entire inspection apparatus and performs a process of inspecting the substrate 110 using the image data acquired by the image acquisition unit 100.

The image acquisition unit 100 includes an electron source 101, an illumination lens 102, an aperture mask 103, a lens 104, a Wien filter 105, an objective lens 106, a deflector 107, an accelerating electrode 108, a stage 109, a stage position determining unit 111, a lens 120, a deflector 121, and a detector 130. The substrate 110, serving as an inspection target, is placed on the stage 109. The substrate 110 is, for example, an exposure mask to be used to manufacture a semiconductor device.

FIG. 2 is a schematic diagram illustrating the configuration of the aperture mask 103. Referring to FIG. 2, the aperture mask 103 has holes (apertures) H arranged in a matrix of m columns extending in a longitudinal direction (y direction) of the mask×n rows extending in a lateral direction (x direction) thereof (m, n≥2) at a predetermined pitch. For example, the holes H are rectangular or circular and have the same shape and dimensions.

The illumination lens 102 allows an electron beam emitted vertically downward from the electron source 101 to be applied substantially perpendicular to the entirety of the aperture mask 103. The electron beam is applied to an area including all of the holes H of the aperture mask 103. The electron beam passes through the holes H, thus forming multiple beams.

The aperture mask 103 may be a blanking aperture array that includes deflecting electrodes arranged on an upstream or downstream side of each of the holes H or an inner wall of the hole H. By placing an limiting aperture (not shown) at the cross over position beneath the blanking aperture array, the deflected electrons can be blocked at the limiting aperture. Thus, currents of the electron beams that reach the surface of the sample can be individually controlled.

The Wien filter 105 is configured such that applied electric and magnetic fields are orthogonal to the vertical direction. Electrons that enter the Wien filter 105 from above travel straight due to forces of the electric and magnetic fields acting in directions such that the forces cancel each other out. Therefore, the multiple beams reduced by the lens 104 enter the Wien filter 105 from above and travel straight downward through the Wien filter 105.

The multiple beams passed through the Wien filter 105 are focused by the objective lens 106 and are deflected by the deflector 107. The resulting beams are applied to the substrate 110. The electron source 101, the illumination lens 102, the aperture mask 103, the lens 104, the Wien filter 105, the objective lens 106, and the deflector 107 constitute an irradiation part (irradiation device) that irradiates the substrate 110 with the multiple beams in the above-described manner.

Reflected electrons emitted from the substrate 110 are condensed by the objective lens 106 and then enter the Wien filter 105 from below. The reflected electrons that have entered the Wien filter 105 from below are deflected toward the detector 130 by forces of the electric and magnetic fields acting in the same direction. As described above, the Wien filter 105 can separate the electrons to be applied to the substrate 110 from the electrons reflected by the substrate 110.

The reflected electrons, whose traveling direction is deflected by the Wien filter 105, are imaged on the detector 130 by the lens 120. The deflector 121 can deflect the reflected electrons to adjust imaging positions on the detector 130.

The present embodiment is described on the assumption that the reflected electrons are used. Instead of the reflected electrons, secondary electrons may be used. In such a case, the secondary electrons can be accelerated by negatively biasing the substrate 110 and biasing the accelerating electrode 108 to the ground potential through a potential applying circuit 204.

The multiple beams are applied to the substrate 110. In addition, the multiple beams are imaged on the detector 130. The detector 130 has a plurality of detecting elements corresponding one-to-one to the multiple beams. FIG. 3A illustrates an example of beams B applied to the substrate 110. FIG. 3B illustrates a two-dimensional array of detecting elements 132 included in the detector 130. The detector 130 includes multi-channel detecting elements. For example, a micro-channel plate can be used. Each of the detecting elements 132 detects the applied reflected electron beam as an electrical signal. A detection value of the signal serves as pixel data of a pattern image formed on the detector 130.

The detecting elements 132 of the detector 130 are arranged at a position conjugate to a pattern surface of the substrate 110.

The amount of deflection of the multiple beams by the deflector 107 is smaller than an inspection area of the substrate 110. To inspect the whole of the inspection area, the multiple beams are applied to the substrate 110 while the stage 109 is being moved. FIG. 4 illustrates a schematic diagram explaining an exemplary inspection operation. As illustrated in FIG. 4, an inspection area 40 of the substrate 110 is virtually divided into a plurality of stripe segments 42 that are strip-shaped parts having a predetermined width arranged in, for example, the y direction. First, the stage 109 is moved and adjusted such that an irradiation range 44, which can be irradiated with one-time irradiation of the multiple beams, is located at the left end of the first stripe segment 42 or at a position to the left of the left end thereof. Then, irradiation is started.

In inspecting the first stripe segment 42, the stage 109 is moved in, for example, the −x direction, such that the beams are relatively scanned in the x direction. The stage 109 is continuously moved at a predetermined speed. Upon irradiation of the first stripe segment 42, the stage is moved in the −y direction and the position of the state is adjusted such that the irradiation range is relatively positioned in the y direction and is located at the right end of the second stripe segment 42 or at a position to the right of the right end thereof. The stage 109 is then moved in the x direction such that irradiation is similarly performed in the −x direction. The multiple beams are applied in a zigzag manner such that the beams are applied to the third stripe segment 42 in the x direction and the beams are applied to the fourth stripe segment 42 in the −x direction. This results in a reduction in inspection time.

The manner of irradiation is not limited to the above-described zigzag manner. In inspecting the stripe segments 42, irradiation may be performed in the same direction. The multiple beams formed by passing through the holes H of the aperture mask 103 allow a plurality of beam patterns equal in number to the holes H to be applied at once.

Figure 5A:
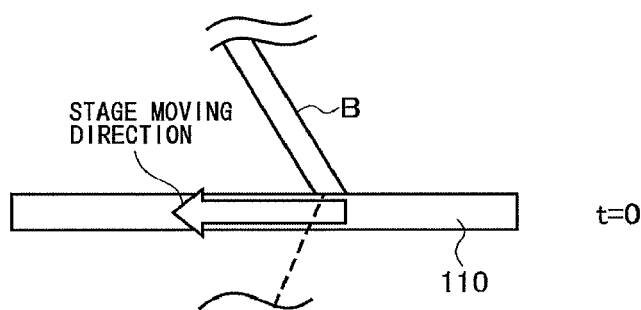
FIGS. 5A to 5C are diagrams illustrating an electron beam following the movement of a stage.
Figure 5B:
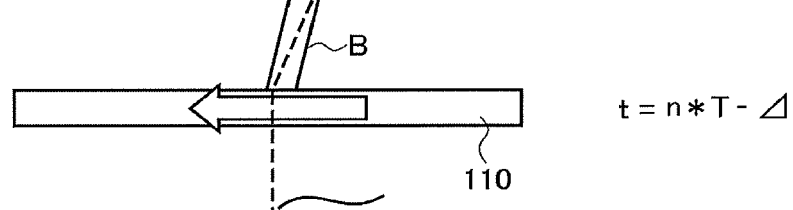
Figure 5C:
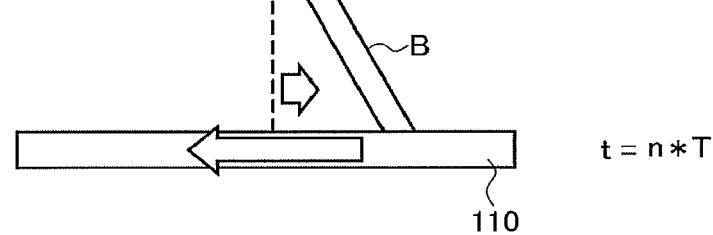

As illustrated in FIGS. 5A and 5B, while following the movement of the stage 109, the deflector 107 deflects the electron beam B such that the electron beam B is applied at the same position on the substrate 110 for a predetermined time n*T (n: a natural number) in terms of unit time T. This is called tracking deflection. In addition to tracking deflection, as illustrated in FIGS. 6A to 11G, slight deflection for irradiation of the electron beams B at different positions on the sample is performed m times (m: 0 or a natural number). After a lapse of the predetermined time n*T, as illustrated in FIG. 5C, the deflector 107 returns the electron beam B to its original position to shift a beam irradiation position on the substrate 110.

The moving position of the stage 109 is determined by the stage position determining unit 111. As the stage position determining unit 111, for example, a laser measuring system may be used.

Figure 6A:
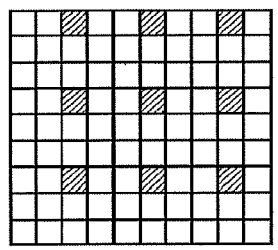
FIGS. 6A to 6E are diagrams explaining an exemplary way of scanning multiple beams.
Figure 6B:
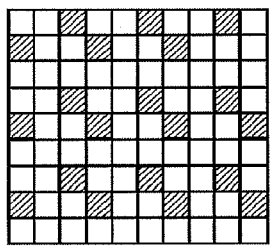
Figure 6C:
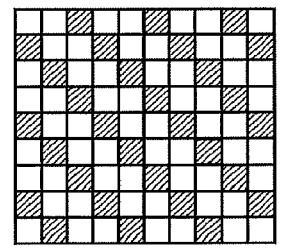
Figure 6D:
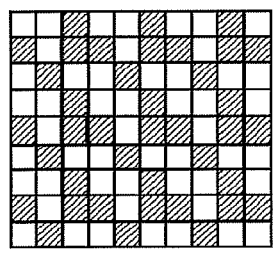
Figure 6E:
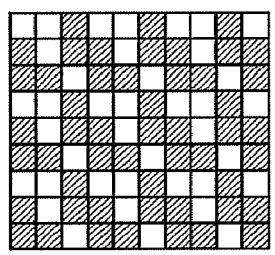
Figure 7F:
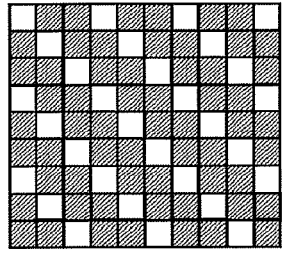
FIGS. 7F to 7I are diagrams explaining the exemplary way of scanning the multiple beams.
Figure 7G:
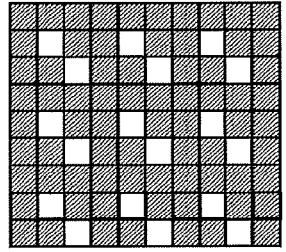
Figure 7H:
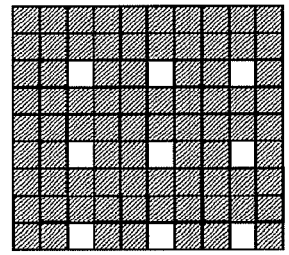
Figure 7I:
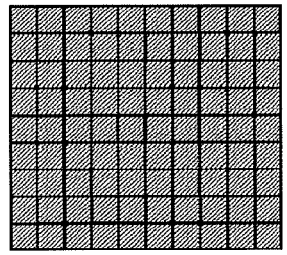

FIGS. 6A to 6E and FIGS. 7F to 7I are schematic diagrams explaining an exemplary way of scanning the multiple beams. FIG. 6A illustrates regions (pixels) to be first irradiated. Subsequently, as illustrated in FIGS. 6B to 6E and FIGS. 7F to 7I, the beams are applied to pixels that have not yet been irradiated while irradiation positions are shifted in the x direction and/or the y direction.

Figure 8A:
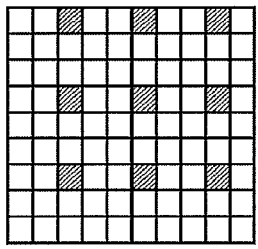
FIGS. 8A to 8E are diagrams explaining another exemplary way of scanning multiple beams.
Figure 8B:
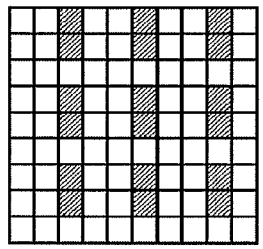
Figure 8C:
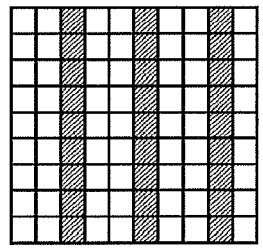
Figure 8D:
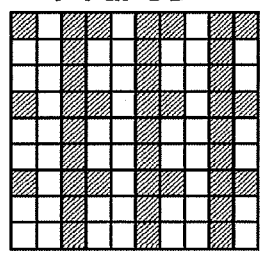
Figure 8E:
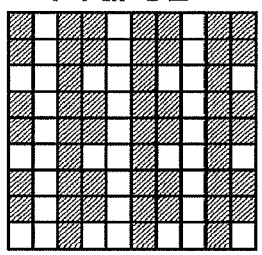
Figure 9F:
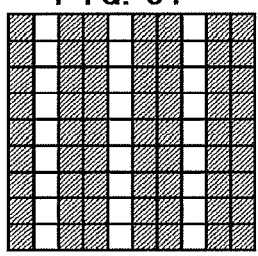
FIGS. 9F to 9I are diagrams explaining the exemplary way of scanning the multiple beams.
Figure 9G:
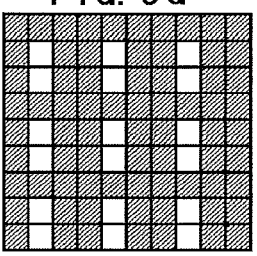
Figure 9H:
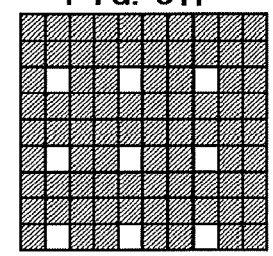
Figure 9I:
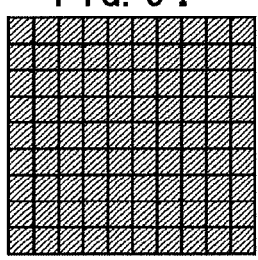

FIGS. 8A to 8E and FIGS. 9F to 9I are schematic diagrams explaining another exemplary way of scanning the multiple beams. FIG. 8A illustrates regions (pixels) to be first irradiated. As illustrated in FIGS. 8B and 8C, second irradiation and third irradiation are sequentially performed on pixels that have not yet been irradiated while irradiation positions are shifted by one pixel in the y direction. Then, as illustrated in FIG. 8D, irradiation positions are shifted by one pixel in the x direction and fourth irradiation is performed on pixels that have not yet been irradiated. Then, as illustrated in FIGS. 8E and 9F, fifth irradiation and sixth irradiation are performed on pixels that have not yet been irradiated while irradiation positions are shifted by one pixel in the y direction. After that, as illustrated in FIGS. 9G to 9I, irradiation positions are shifted in the x direction or the y direction and the beams are applied to pixels that have not yet been irradiated.

Figure 10A:
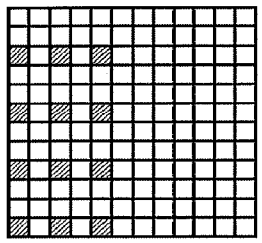
FIGS. 10A to 10D are diagrams explaining still another exemplary way of scanning multiple beams.
Figure 10B:
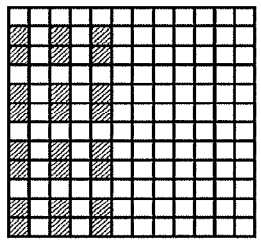
Figure 10C:
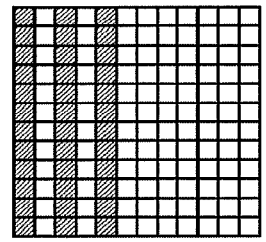
Figure 10D:
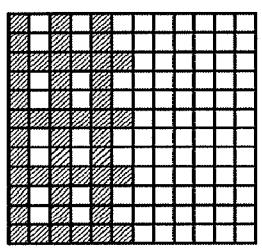
Figure 11E:
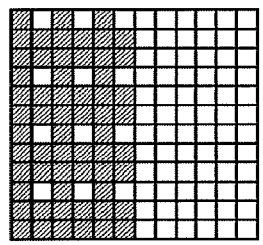
FIGS. 11E to 11G are diagrams explaining the exemplary way of scanning the multiple beams.
Figure 11F:
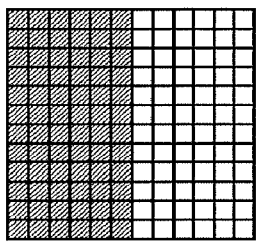
Figure 11G:
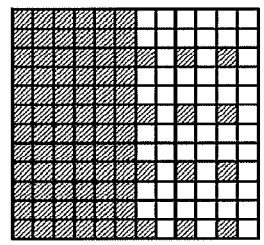

FIGS. 10A to 10D and FIGS. 11E to 11G are schematic diagrams illustrating still another way of scanning the multiple beams. For example, inspection using 3×4 multiple beams arranged in the x and y directions is illustrated as an example. FIG. 10A illustrates regions (pixels) to be first irradiated. As illustrated in FIGS. 10B and 10C, second irradiation and third irradiation are sequentially performed on pixels that have not yet been irradiated while irradiation positions are shifted by one pixel in the y direction. Then, as illustrated in FIG. 10D, irradiation positions are shifted by one pixel in the x direction and fourth irradiation is performed on pixels that have not yet been irradiated. Then, as illustrated in FIGS. 11E and 11F, fifth irradiation and sixth irradiation are performed on pixels that have not yet been irradiated while irradiation positions are shifted by one pixel in the y direction. Then, as illustrated in FIG. 11G, irradiation positions are shifted in the x direction by a distance corresponding to the width of the assembly of the regions irradiated with the multiple beams and the beams are similarly applied. During the sixth irradiation, the stage is continuously moved in the x direction. Typically, the distance of movement of the stage is substantially equal to the width of the assembly of the regions irradiated with the multiple beams.

In the above-described way, the stage can be substantially stopped during irradiation and be moved in the x direction by the distance corresponding to the width of the assembly of the regions irradiated with the multiple beams at completion of the irradiation. Advantageously, such an operation facilitates control because the amount of deflection in tracking is small. Disadvantageously, however, the overall inspection time increases because irradiation with electron beams is not performed while the stage is moved. If electron beam irradiation time is longer than the time required to move the stage and the ratio of the stage movement time to the overall inspection time is small, an increase in inspection time can be reduced.

The multiple beams are scanned over the inspection area of the substrate 110 in the above-described manner, so that pattern images of the substrate 110 are formed on the detector 130 by the reflected electrons. The pattern images (reflected electrons) are detected by the detector 130. For example, the reflected electrons are converted into light and the light is converted into electrical signals, so that the signal amounts of the reflected electrons are detected.

As illustrated in FIG. 1, the arithmetic and control unit 200 includes a control computer 201, a detection signal processing unit 202, a deflection control circuit 203, the potential applying circuit 204, a reference image generating unit 211, a comparing unit 212, and a storage device 220, such as a magnetic disk unit. The storage device 220 (storage unit) stores design data of the substrate 110.

The detection signal processing unit 202 acquires the electrical signal amounts of reflected electrons, serving as pixel data of pattern images (images), from the detector 130 and transfers the data to the control computer 201. The control computer 201 uses the pixel data to reproduce image data of the patterns formed on the substrate 110.

The deflection control circuit 203 controls the amount of beam deflection by the deflector 107 so that the multiple beams are applied at intended positions on the substrate 110. In addition, the deflection control circuit 203 controls the amount of beam deflection by the deflector 121 so that multiple beams (reflected multiple beams) of reflected electrons are imaged at intended positions on the detector 130. The deflection control circuit 203 adjusts the amount of beam deflection by the deflector 121 so that each of the reflected beams resulting from the beams following the movement of the substrate 110 is imaged on the corresponding detecting element 132.

The potential applying circuit 204 applies a potential to the substrate 110 to accelerate secondary electrons.

The reference image generating unit 211 generates reference image data by converting the design data in the storage device 220 into image data. The reference image data contains, for example, 8-bit unsigned data for each pixel and represents the gray-scale level (light intensity) of brightness of each pixel.

The comparing unit 212 aligns and compares the image data, reproduced based on the pixel data acquired from the detector 130 by the detection signal processing unit 202, with the reference image data generated by the reference image generating unit 211. Thus, a defect of the patterns formed on the substrate 110 can be detected.

Figure 12:
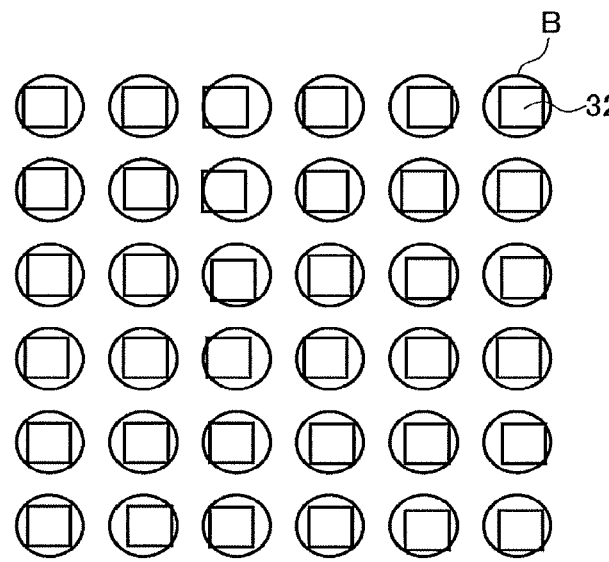
FIG. 12 is a diagram illustrating detecting elements in Comparative Example.

Referring to FIG. 12, detecting elements 32 having a light receiving area smaller than the size of the beam B imaged on a detector will fail to accurately detect the signal amounts of reflected electrons, leading to reduced inspection accuracy.

Figure 13:
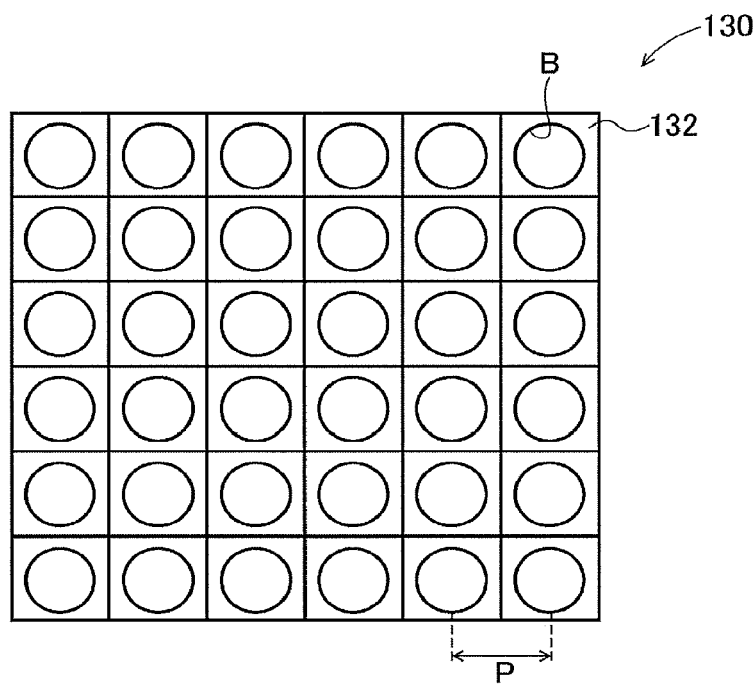
FIG. 13 is a diagram illustrating detecting elements in the embodiment.

According to the present embodiment, as illustrated in FIG. 13, a size that covers a beam blur of the beam B imaged on the detector 130 is obtained in advance. The detector 130 including the detecting elements 132 greater than the obtained size is used. Consequently, the signal amounts of reflected electrons can be accurately detected. This prevents a reduction in inspection accuracy. The arrangement pitch P of the detecting elements 132 is greater than the size that covers the sum of size of the image and beam blur of the beam B.

Beam blur is defined, for example, as follows. The beam current distribution on the detector 130 is fitted by a convolution of the reflected electron distribution on the wafer surface imaged on the detector 130 and the Gaussian distribution $C \exp(-(r/b)^2)$, where r is the distance from the center of the distribution and C is a constant, 2b can be defined as the beam blur. When b is sufficiently larger the size of the image of the incident beam on the detector, d, we can use 2b as the beam blur and also a beam size. When d is sufficiently larger than b, and the beam distribution can be approximated by error function, d+2b can be used as the beam size instead. Other definition can be used depending on the required conditions. The beam blur is not always axially symmetric. In these cases, different distribution with a blur defined differently will be used. The shape of the reflected electron distribution imaged on the detector surface can be also distorted. In these cases, for example, the largest distance of two points in the image can be used as the size of the image d.

Figure 14:
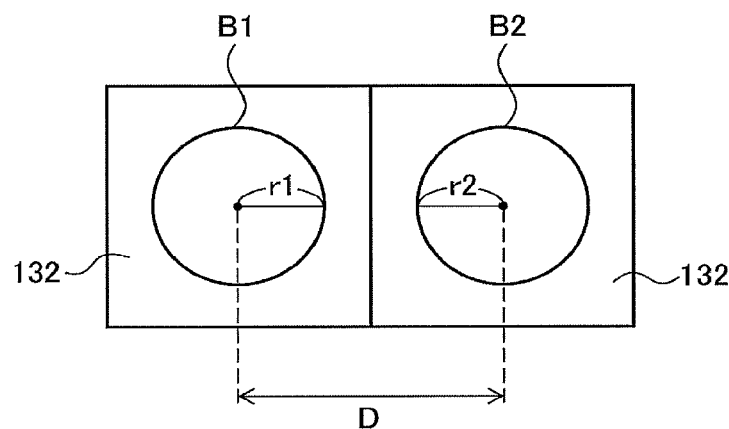
FIG. 14 is a diagram illustrating adjacent beams on the detector.

As illustrated in FIG. 14, preferably, a distance D between two adjacent beams B1 and B2 on the detector 130 is greater than the sum of a dimension r1 that is half the size of the beam B1 and a dimension r2 that is half the size of the beam B2 such that the adjacent beams B1 and B2 do not overlap each other.

Figure 15:
FIG. 15 is a diagram illustrating the detecting elements in Comparative Example.

As described above, the multiple beams applied to the substrate 110 move to follow the movement of the stage 109. Although the stage 109 is driven by a stage drive mechanism (not illustrated) such that the stage is moved at a constant speed, the speed of the stage may fluctuate. When the stage speed fluctuates, the deflector 107 is controlled based on a signal, indicating a change in stage position, from the stage position determining unit 111 so that the multiple beams can be applied at predetermined positions on the substrate 110. However, assuming that the adjustment of the deflector 121 fails to compensate for deflection by the deflector 107 under conditions where the stage speed differs from a predetermined value, if the deflector 121 deflects beams, beam imaging positions on the detector would shift as illustrated in FIG. 15. In the use of the small detecting elements 32, the beams B deviate from the detecting elements 32 and the detecting elements 32 fail to accurately detect the signal amounts of reflected electrons, leading to reduced inspection accuracy.

Figure 16:
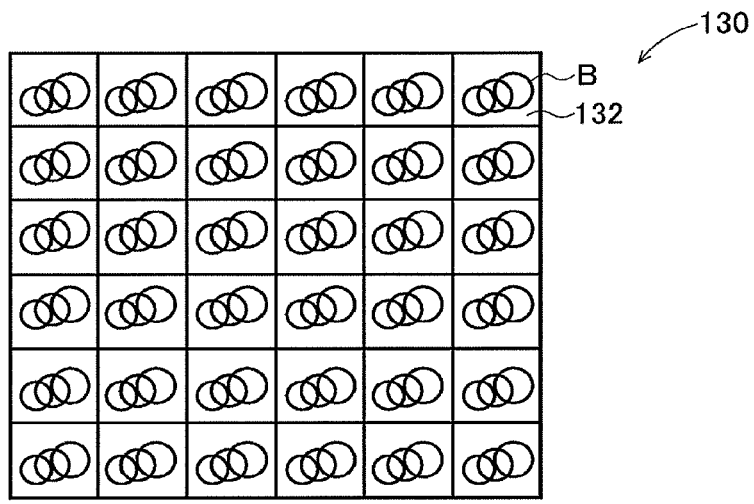
FIG. 16 is a diagram illustrating the detecting elements in the embodiment.

It is therefore preferred that, as illustrated in FIG. 16, the detecting elements 132 each have a size greater than a size obtained by adding a beam shift distance on the detector 130 to the size that covers the beam blur of the beam B. Consequently, if the beams shift on the detector 130, each of the beams is continuously located on the corresponding detecting element 132, which can accurately detect the signal amount of reflected electrons.

Figure 17:
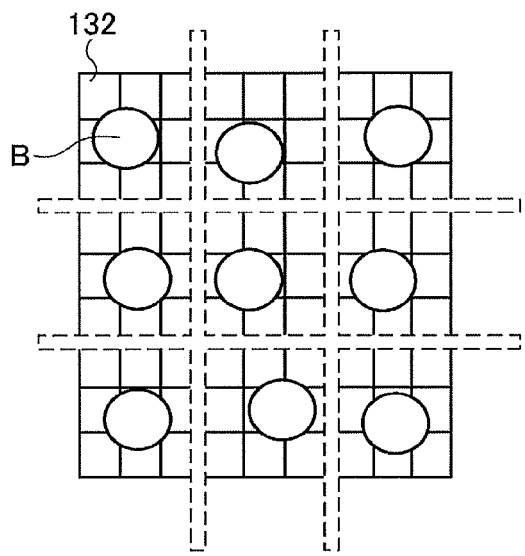
FIG. 17 is a diagram illustrating the detecting elements in the embodiment.

As illustrated in FIG. 17, the signal amount of one beam B may be detected by a plurality of detecting elements 132. Specifically, a plurality of small detecting elements 132 may be grouped and handled as a single detecting element. FIG. 17 illustrates a case where nine detecting elements 132 are grouped and handled as a single detecting element. Signal amounts detected by the nine detecting elements 132 in each group are added to detect one reflected electron beam. Thus, the signal amount of the beam B that spreads over the multiple detecting elements 132 can be accurately detected.

Figure 18:
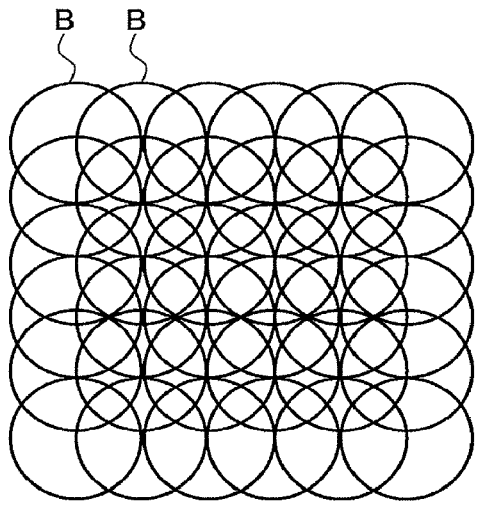
FIG. 18 is a diagram illustrating large beam blurs on the detector.

If the beams significantly blur on the detector 130, the adjacent beams overlap one another as illustrated in FIG. 18, leading to reduced accuracy of detection of the signal amount of each beam B. In such a case, it is preferred to switch each of the multiple beams between a beam (on-state beam) to be applied to the substrate 110 and a beam (off-state beam) not to be applied to the substrate 110. For example, a blanking aperture member can be used for switching between the on-state beam and the off-state beam.

For example, groups of adjacent beams in the x and y directions are formed. One of the beams of each group is set to an on-state beam and the other beams are set to off-state beams. The beams are sequentially switched to the on-state beam. The amount of deflection by the deflector 121 is controlled so that reflected electrons of beams of the same group are detected by the same detecting element 132, thereby correcting an imaging position.

Figure 19:
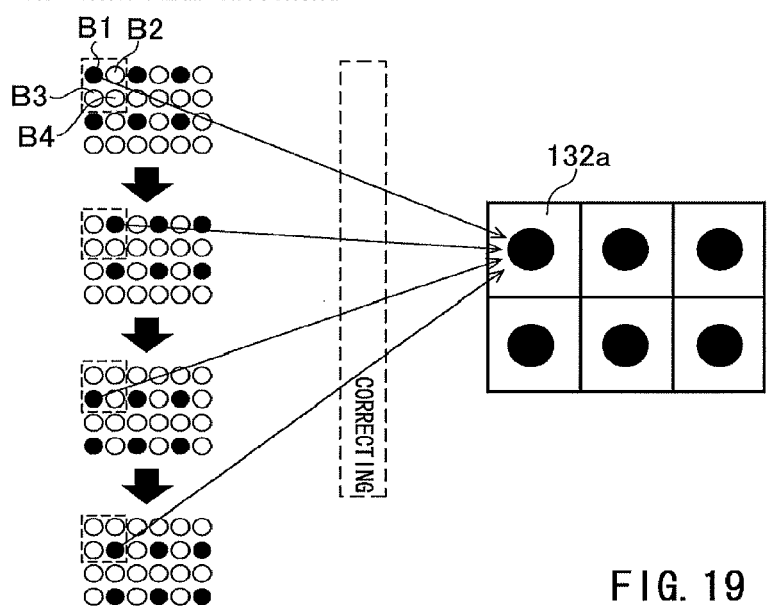
FIG. 19 is a diagram illustrating an exemplary way of switching on-state beams in the embodiment.

FIG. 19 illustrates a case where four adjacent beams B1 to B4 are grouped. The beams B1 to B4 are sequentially set to an on-state beam. Reflected electrons of each of the beams B1 to B4 are detected by a single detecting element 132a. In FIG. 19, on-state beams and off-state beams are alternately arranged in the x and y directions. In other words, each on-state beam is surrounded by the off-state beams. This arrangement increases the interval between the on-state beams, thus preventing images from overlapping one another on the detector 130.

On-state beam switching can be performed by using, for example, a blanking plate (not illustrated) for individually blanking the beams and a limiting aperture member (not illustrated) having an aperture at its central part, which are arranged under the aperture mask 103. The blanking plate has passage holes aligned with the holes H arranged in the aperture mask 103. In each of the passage holes, two electrodes paired (a blanker or blanking deflector) are arranged.

An electron beam passing through each passage hole is independently deflected by the blanker. An electron beam that is not deflected by the blanker is an on-state beam to pass through the aperture of the limiting aperture member and be applied to the substrate 110. An electron beam deflected by the blanker is an off-state beam to be interrupted by the limiting aperture member.

In the above-described embodiment, a plurality of beams, serving as multiple beams, may have different beam intensities. If the multiple beams include high-intensity beams and low-intensity beams, signal amounts detected by the detecting elements 132 have to be corrected in consideration of the differences in intensity.

For example, multiple beams are applied to a test substrate in advance, imaging positions of reflected electrons are changed by the deflector 121, and the reflected electrons of the beams are sequentially detected by the same detecting element 132. If the beams have the same intensity, the detecting element 132 will indicate the same detection value. The intensities (distribution of intensities) of the beams are obtained from detection results of the detecting element 132 and are stored as a correction table to the storage unit (not illustrated). The detection signal processing unit 202 or the comparing unit 212 corrects pixel data of pattern images with reference to the correction table.

In the above-described embodiment, the detecting elements 132 included in the detector 130 may have different sensitivities. If the detector 130 includes high-sensitivity detecting elements 132 and low-sensitivity detecting elements 132, signal amounts detected by the detecting elements 132 have to be corrected in consideration of the differences in sensitivity.

For example, beams are applied to the test substrate in advance, imaging positions of reflected electrons are changed by the deflector 121, and all of the detecting elements 132 are sequentially used to detect the reflected electrons of one beam. If the detecting elements 132 have the same sensitivity, the detecting elements will indicate the same detection value. The sensitivities (distribution of sensitivities) of the detecting elements 132 are obtained from detection results of the detecting elements 132 and are stored as a correction table to the storage unit (not illustrated). The detection signal processing unit 202 or the comparing unit 212 corrects pixel data of pattern images with reference to the correction table.

Figure 20:
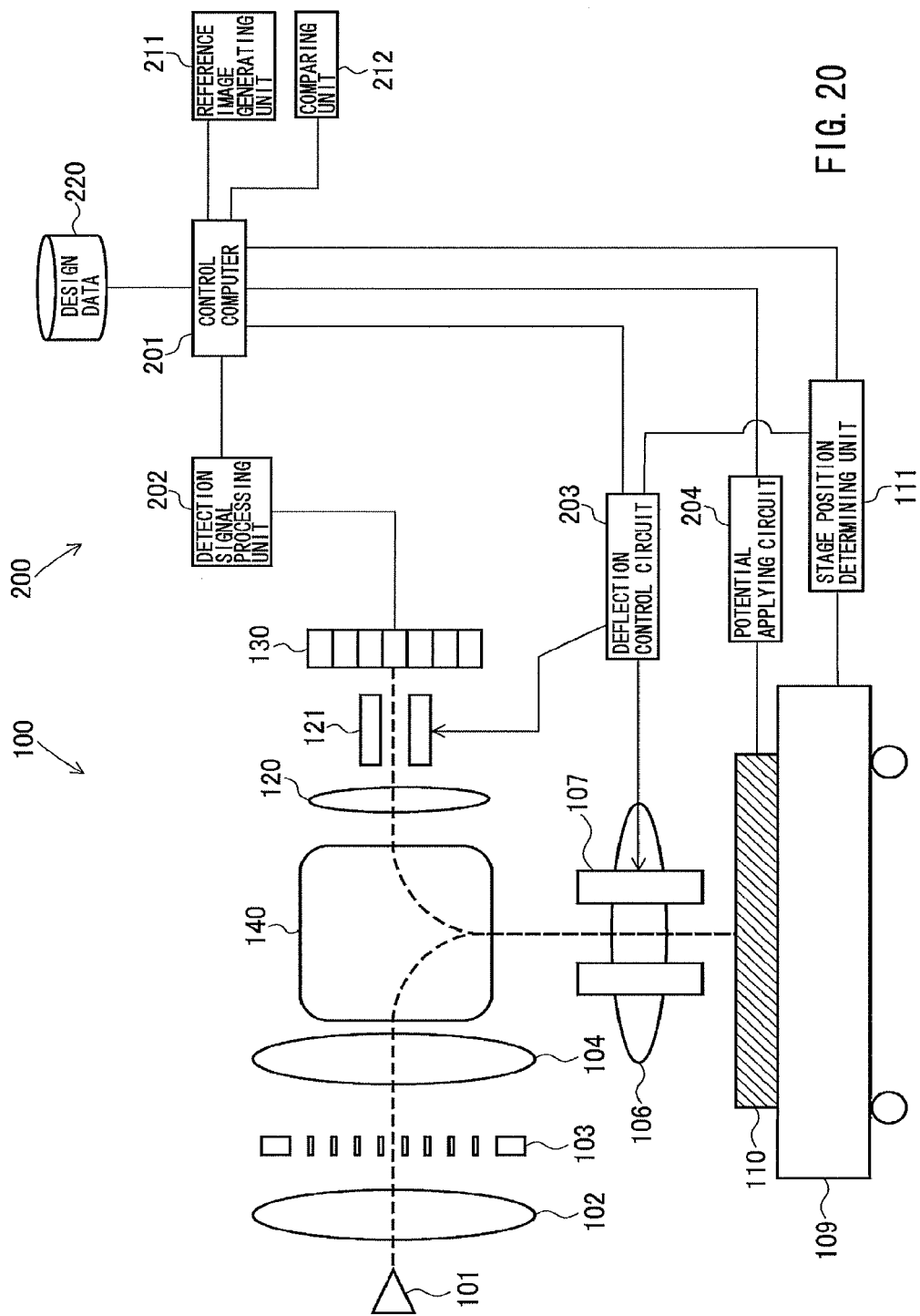
FIG. 20 is a schematic diagram illustrating an inspection apparatus according to a modification.

In the above-described embodiment, the Wien filter 105 is used to separate electrons to be applied to the substrate 110 from electrons reflected by the substrate 110. As illustrated in FIG. 20, an electromagnetic prism 140 may be used instead of the Wien filter 105. In FIG. 20, the same components as those in FIG. 1 are designated by the same reference numerals and a description of these components is omitted.

The Wien filter 105 in FIG. 1 allows electrons that enter the filter from above to travel straight and bends the path of electrons that enter the filter from below. The electromagnetic prism 140 in FIG. 20 bends the path of electrons that enter the prism, irrespective of the direction of incidence. The electromagnetic prism 140 directs the path of the multiple beams reduced by the lens 104 toward the substrate 110. In addition, the electromagnetic prism 140 directs the path of reflected electrons emanating from the substrate 110 toward the detector 130.

Figure 21:
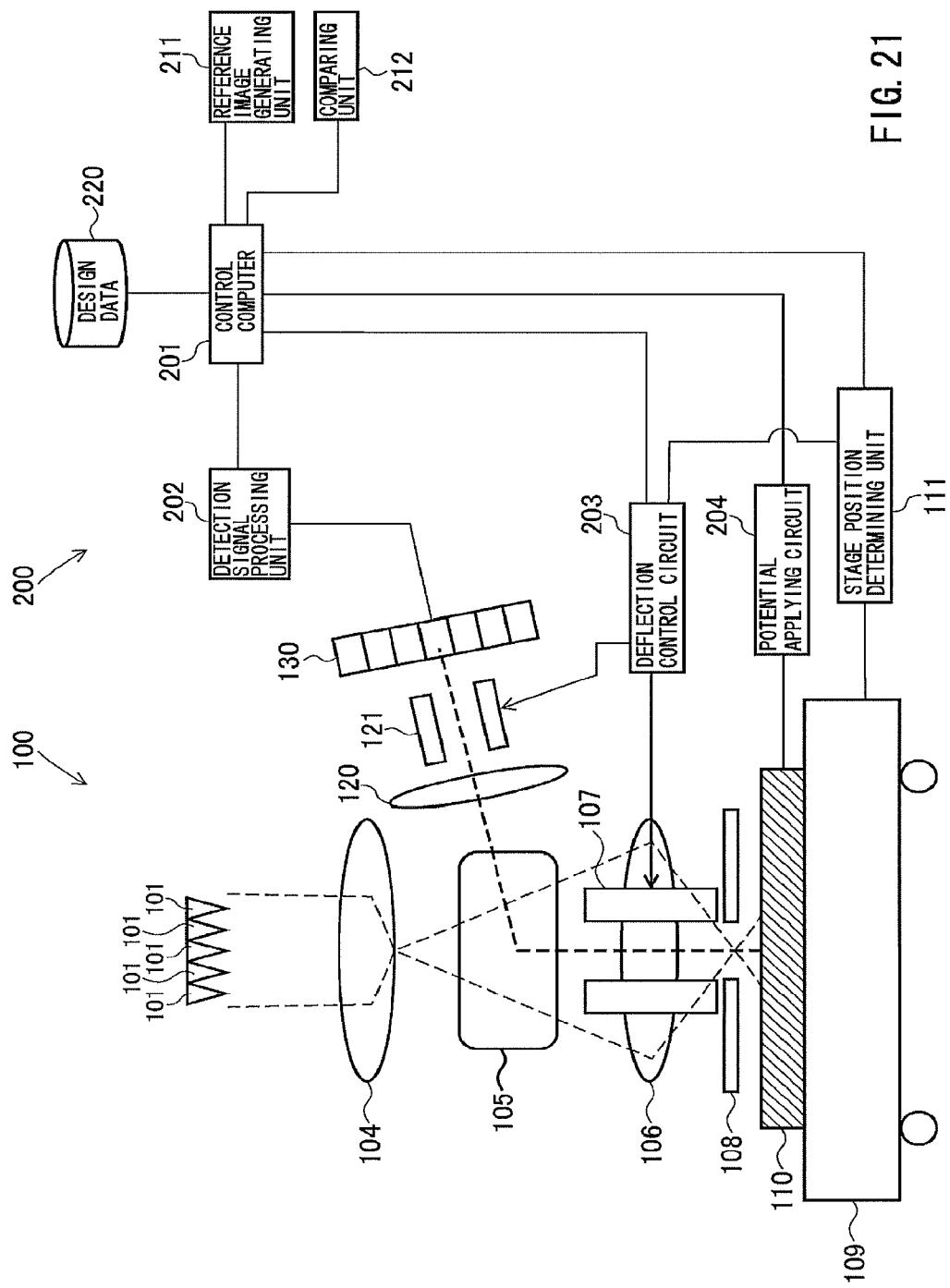
FIG. 21 is a schematic diagram illustrating an inspection apparatus according to another modification.

In the above-described embodiment, the electron beam (single beam) emitted from the electron source 101 is allowed to pass through the holes H of the aperture mask 103, thus forming the multiple beams. As illustrated in FIG. 21, a plurality of electron sources 101 may be arranged. Each of the electron sources 101 may emit an electron beam (single beam) to form multiple beams. In this case, the electron sources 101 can be individually controlled such that the on/off state of the electron beam emitted from each electron source 101 is controlled.

In the above-described embodiment, while the deflector 107 is returning the electron beams B to their original positions as illustrated in FIG. 5C, preferably, the detector 130 stops detecting signals. For example, the deflector 121 deflects the beams such that the beams are not imaged on the detecting elements 132. In the case where the above-described blanking plate and the limiting aperture member are arranged under the aperture mask 103, these components may be used to set the multiple beams to the off state. To blank all the beams, one blanking deflector unit which deflects all the beams can be used instead. In this case, the blanking deflector is placed between the aperture plate 103 and the limiting aperture. Alternatively, the detecting elements 132 may stop acquiring signals.

In the above-described embodiment, the two-dimensional array of multiple beams and the two-dimensional array of detecting elements 132 have been described as an example. A one-dimensional array of multiple beams and a one-dimensional array of detecting elements 132 may be used.

In the above-described embodiment, the reference image data based on the design data of the substrate to be inspected is used. The reference image data is not limited to this example. For example, image data obtained by inspecting identical patterns formed at different positions on a single substrate or formed on different substrates may be used as reference image data.

In the above-described embodiment, the configuration for applying electron beams to the substrate 110 has been described. Another energy beams, such as ion beams, neutral particle beams, X-ray, or laser beams, may be applied. In applying ion beams, the detector 130 may detect ion beams of ions released from the substrate 110 instead of electron beams of electrons released from the substrate 110.

At least part of the arithmetic and control unit 200 described in the above embodiments may be implemented in either hardware or software. When implemented in software, a program that realizes at least part of functions of the arithmetic and control unit 200 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An inspection apparatus comprising:
   an irradiation part irradiating an inspection target substrate with multiple beams including energy beams;
   a detector on which a plurality of charged particle beams of charged particles released from the inspection target substrate are imaged, the detector detecting each of the charged particle beams as an electrical signal; and
   a comparing processing circuitry comparing reference image data and image data that is reproduced based on the detected electrical signals and that represents patterns formed on the inspection target substrate to inspect the patterns,
   wherein the detector includes a plurality of detecting elements corresponding to the charged particle beams, and
   wherein the detecting elements each have a size greater than a size that covers a beam blur of each charged particle beam imaged on the detector.

2. The apparatus according to claim 1,
   wherein the inspection target substrate is placed on a continuously moving stage,
   wherein the irradiation part performs tracking deflection of the multiple beams such that irradiation positions of the multiple beams are shifted to follow movement of the stage, and
   wherein the detecting elements each have a size greater than a size obtained by adding a distance of shift of an imaging position of each charged particle beam on the detector, caused by the shift of the irradiation positions of the multiple beams, to the size that covers the beam blur of the charged particle beam imaged on the detector.

3. The apparatus according to claim 2, further comprising:
   a deflector adjusting the imaging positions of the beams on the detector,
   wherein the irradiation part performs the tracking deflection for a predetermined time and then returns the irradiation positions of the multiple beams to predetermined positions, and
   wherein while the irradiation part is returning the irradiation positions to the predetermined positions, the deflector deflects the charged particle beams such that the charged particle beams are not imaged on the detecting elements.

4. The apparatus according to claim 1, wherein the irradiation part irradiates the inspection target substrate with only some of the energy beams and sequentially switches the energy beams to the beams to be applied to the inspection target substrate.

5. The apparatus according to claim 4, wherein the irradiation part divides the energy beams into groups each including adjacent energy beams, sets one of the energy beams of each group to an on-state beam, sets the other energy beams of the group to off-state beams, and sequentially switches the beams in the group to the on-state beam.

6. The apparatus according to claim 5, wherein the charged particle beams corresponding to the energy beams of the same group are imaged on the same detecting element in the detector.

7. The apparatus according to claim 1, wherein the image data is corrected based on a distribution of intensities of the energy beams or a distribution of sensitivities of the detecting elements.

8. An inspection method comprising:
irradiating an inspection target substrate with multiple beams including energy beams;
causing a detector, on which charged particle beams of charged particles released from the inspection target substrate are imaged, to detect currents of the charged particle beams; and
comparing reference image data and image data that is reproduced based on the detected currents and that represents patterns formed on the inspection target substrate to inspect the patterns,
wherein the currents are detected with a plurality of detecting elements included in the detector, the detecting elements each having a size greater than a size that covers a beam blur of each charged particle beam imaged on the detector.

9. The method according to claim 8,
wherein the inspection target substrate is placed on a continuously moving stage,
wherein the multiple beams are subjected to tracking deflection such that irradiation positions of the multiple beams are shifted to follow movement of the stage, and
wherein the detecting elements each have a size greater than a size obtained by adding a distance of shift of an imaging position of each charged particle beam on the detector, caused by the shift of the irradiation positions of the multiple beams, to the size that covers the beam blur of the charged particle beam imaged on the detector.

10. The method according to claim 9, wherein while the irradiation positions of the multiple beams are returned to predetermined positions after the tracking deflection is performed for a predetermined time, the charged particle beams are not imaged on the detecting elements.

11. The method according to claim 8, wherein the inspection target substrate is irradiated with only some of the energy beams and the energy beams are sequentially switched to the beams to be applied to the inspection target substrate.

12. The method according to claim 11, wherein the energy beams are divided into groups each including adjacent energy beams, one of the energy beams of each group is set to an on-state beam, the other energy beams of the group are set to off-state beams, and the beams in the group are sequentially switched to the on-state beam.

13. The method according to claim 12, wherein the charged particle beams corresponding to the energy beams of the same group are detected by the same detecting element.

14. The method according to claim 8, wherein the image data is corrected based on a distribution of intensities of the energy beams or a distribution of sensitivities of the detecting elements.

15. The method according to claim 14, wherein the distribution of intensities of the energy beams is obtained from detection results about the currents of the charged particle beams detected by using one of the detecting elements.

16. The method according to claim 14, wherein the distribution of sensitivities of the detecting elements is obtained from detection results about one charged particle beam detected by sequentially using the detecting elements, the one charged particle beam being made of charged particles released from the substrate irradiated with one energy beam.

* * * * *